United States Patent
Nemtsev et al.

(10) Patent No.: US 7,052,959 B2
(45) Date of Patent: May 30, 2006

(54) METHOD OF FORMING AN EPROM CELL AND STRUCTURE THEREFOR

(75) Inventors: Gennadiy Nemtsev, Stoughton, MA (US); Yingping Zheng, North Kingstown, RI (US); Rajesh S. Nair, Chandler, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 10/752,772

(22) Filed: Jan. 8, 2004

(65) Prior Publication Data

US 2005/0153512 A1    Jul. 14, 2005

(51) Int. Cl.
*H01L 21/336*    (2006.01)

(52) U.S. Cl. ....................... 438/257; 438/301

(58) Field of Classification Search ................. 438/257, 438/258, 259, 260, 262, 263, 264, 266, 267, 438/278, 289, 290, 291, 301, 972

See application file for complete search history.

(56) References Cited

U.S. PATENT DOCUMENTS

| | | | | |
|---|---|---|---|---|
| 4,590,504 A * | 5/1986 | Guterman | .................... | 257/320 |
| 4,649,520 A * | 3/1987 | Eitan | ........................ | 365/185.1 |
| 4,701,776 A * | 10/1987 | Perlegos et al. | ............. | 257/321 |
| 4,979,004 A * | 12/1990 | Esquivel et al. | ........... | 357/23.5 |
| 5,227,326 A * | 7/1993 | Walker | ........................ | 438/258 |
| 5,465,231 A | 11/1995 | Ohsaki | | |
| 5,471,422 A * | 11/1995 | Chang et al. | .......... | 365/185.26 |
| 5,480,820 A * | 1/1996 | Roth et al. | ................... | 438/257 |
| 5,501,996 A | 3/1996 | Yang et al. | | |
| 5,646,060 A * | 7/1997 | Chang et al. | ................ | 438/264 |
| 5,747,846 A | 5/1998 | Iida et al. | | |
| 5,763,912 A * | 6/1998 | Parat et al. | .................. | 257/315 |
| 5,776,787 A * | 7/1998 | Keshtbod | .................... | 438/257 |
| 5,929,478 A | 7/1999 | Parris et al. | | |
| 6,627,947 B1 * | 9/2003 | Hu et al. | ..................... | 257/318 |
| 6,653,684 B1 * | 11/2003 | Fournel et al. | ............. | 257/319 |
| 6,841,821 B1 * | 1/2005 | Hsu | ........................... | 257/305 |

* cited by examiner

*Primary Examiner*—David Nhu
(74) *Attorney, Agent, or Firm*—Robert F. Hightower

(57) ABSTRACT

An EPROM cell includes a control gate and a control transistor. A portion of the control transistor is formed as a portion of the control gate.

14 Claims, 3 Drawing Sheets

METHOD OF FORMING AN EPROM CELL AND STRUCTURE THEREFOR

BACKGROUND OF THE INVENTION

The present invention relates, in general, to electronics, and more particularly, to methods of forming semiconductor devices and structure.

In the past, the electronics industry utilized various methods and structures to build electrically programmable read only memory (EPROM) cells and devices. Typically each EPROM cell utilized an N-channel metal oxide semiconductor (NMOS) transistor that had a floating gate which was capacitively coupled to a control gate. Each cell also used a control transistor that applied an electrical potential to the control gate in order to program the EPROM. When the control transistor was energized in order to program the EPROM cell, a large depletion region was formed around the control gate. Because of this large depletion region, the control transistor typically was a large distance away from the control gate so that the depletion region would not adversely affect the programming operation. Examples such an EPROM cell along with the associated NMOS transistor and control gate are disclosed in U.S. Pat. No. 4,649,520 issued to Boaz Eitan on Mar. 10, 1987 and also in U.S. Pat. No. 5,747,846 issued to Makio Iida et al on May 5, 1998 both of which are hereby incorporated herein by reference.

One problem with previous EPROM cells was the area consumed by the EPROM cell. Because the control transistor was located a large distance away from the control gate, the EPROM cell occupied a large area.

Accordingly, it is desirable to have an EPROM cell that includes a floating gate and a control transistor, and that utilizes a small area.

For simplicity and clarity of illustration, elements in the figures are not necessarily to scale, and the same reference numbers in different figures denote the same elements. Additionally, descriptions and details of well-known steps and elements are omitted for simplicity of the description. Although the devices are explained herein as certain N-channel or P-Channel devices, a person of ordinary skill in the art will appreciate that complementary devices are also possible in accordance with the present invention.

DETAILED DESCRIPTION OF THE DRAWINGS

Figure 1:
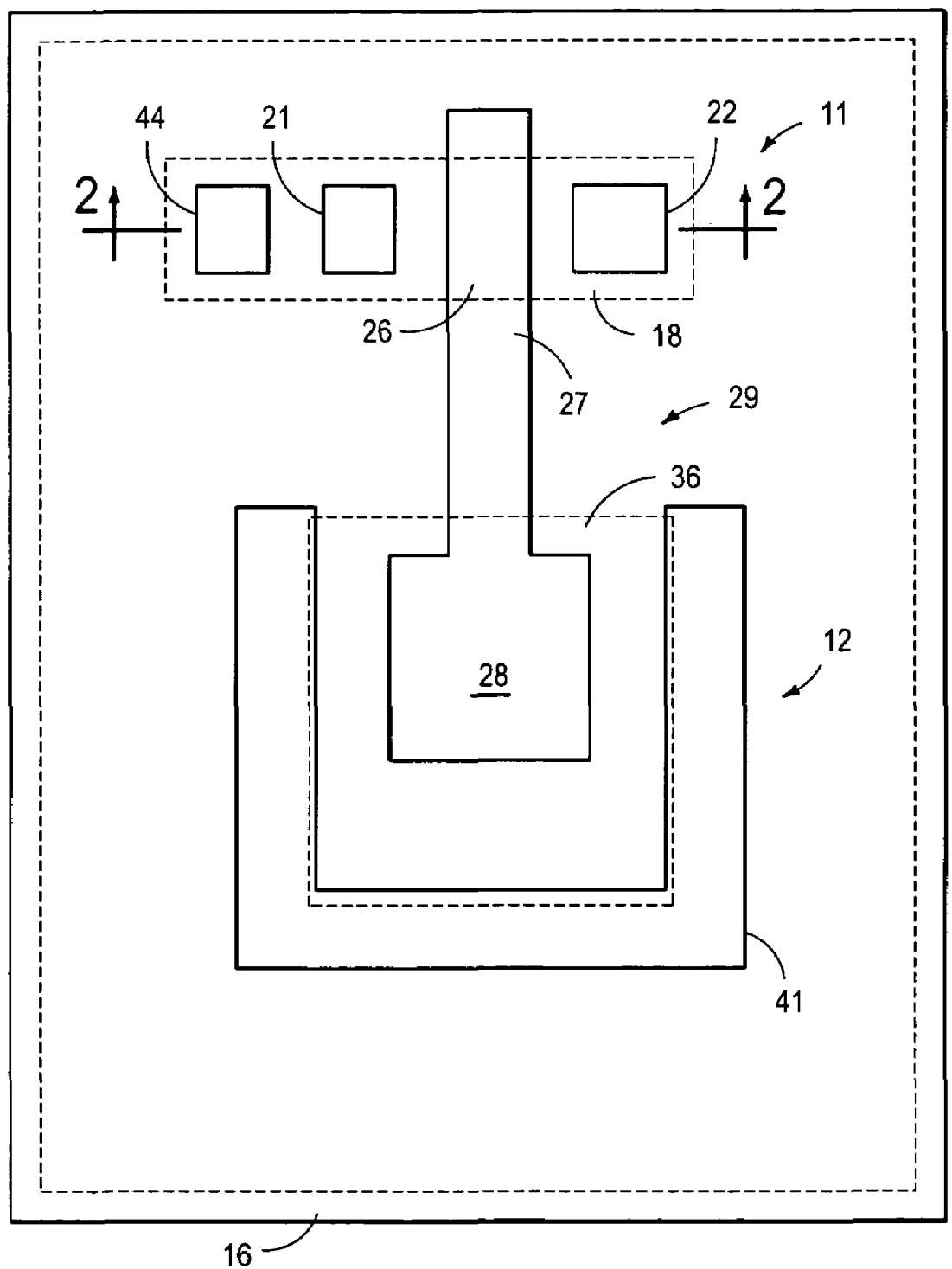
FIG. 1 schematically illustrates an enlarged plan view of a portion of an embodiment of an EPROM cell in accordance with the present invention.

FIG. 1 schematically illustrates an enlarged plan view of an embodiment of an EPROM cell 10 that occupies a small area. Cell 10 includes an MOS transistor 11 that functions as the EPROM memory element, a control gate, and a control transistor 12. As will be seen further hereinafter, control transistor 12 is integrated with the control gate such that a portion of control transistor 12 is also a portion of the control gate. Cell 10 also includes a floating gate 29 that has a first portion 26 which functions as the gate of transistor 11, a second portion 27, and a third portion 28 that functions to couple the control gate to transistor 11. Second portion 27 of floating gate 29 electrically connects portions 26 and 28.

Figure 2:
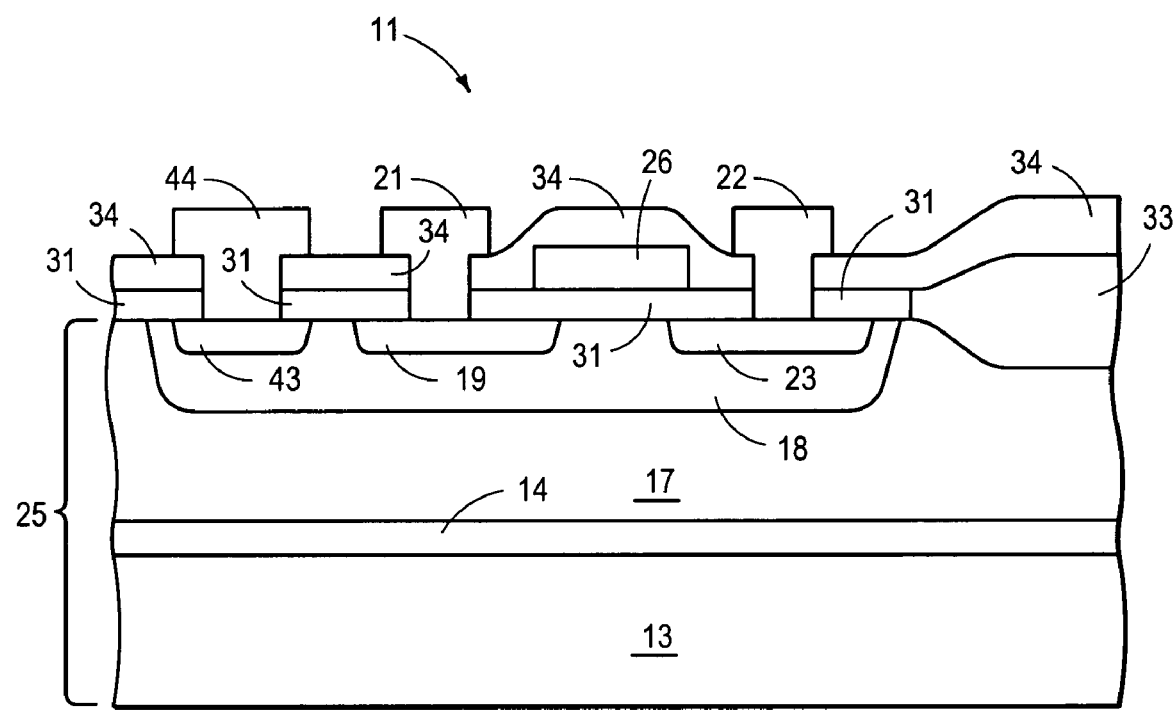
FIG. 2 schematically illustrates an enlarged cross-sectional view of a portion of an embodiment of the EPROM cell of FIG. 1 in accordance with the present invention.

FIG. 2 schematically illustrates an enlarged cross-sectional view of an embodiment of cell 10 that is shown in FIG. 1 along cross section lines 2—2.

Figure 3:
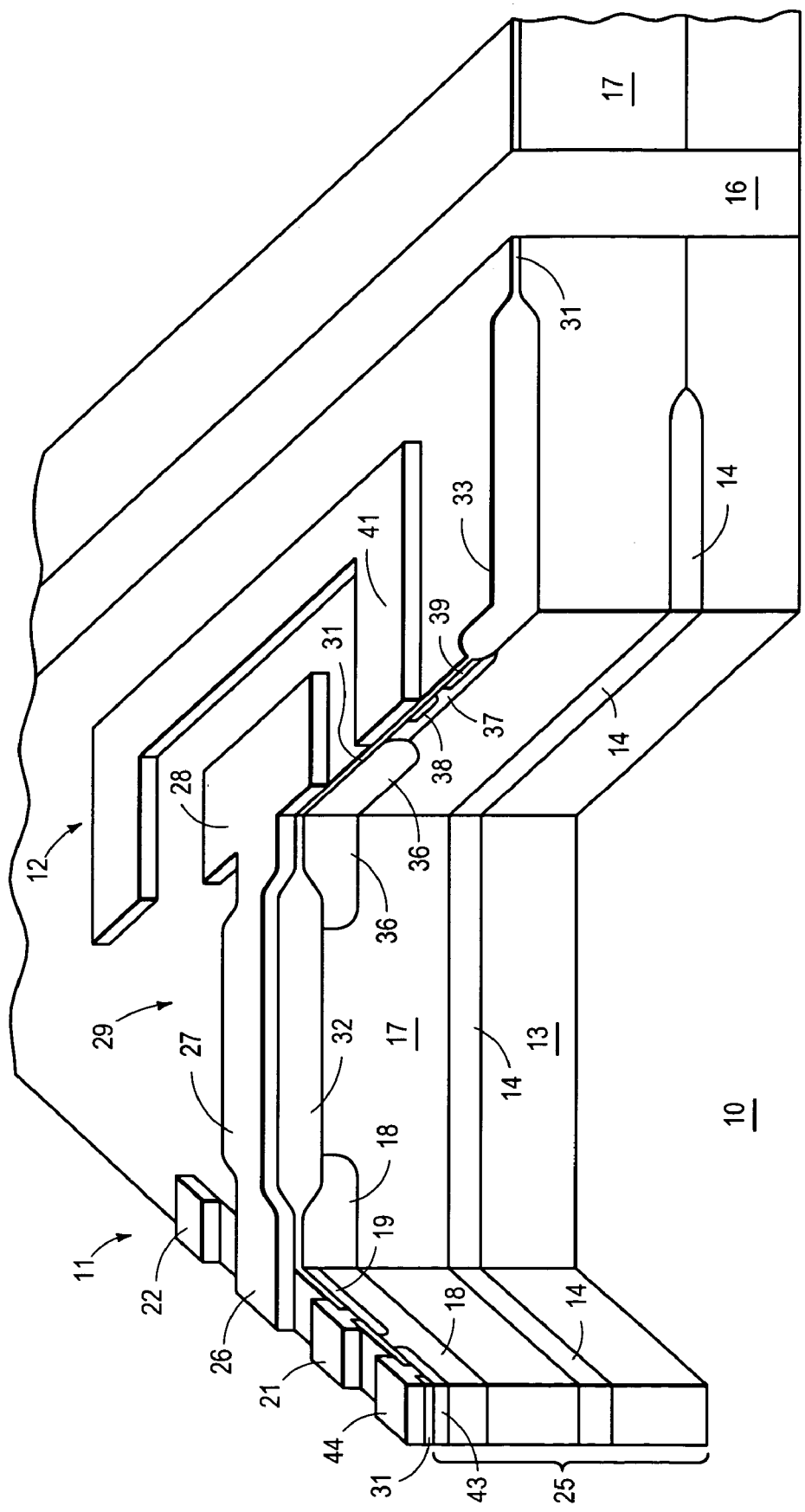
FIG. 3 schematically illustrates an enlarged cut-away perspective view of a portion of an embodiment of the EPROM cell of FIG. 1 in accordance with the present invention.

FIG. 3 schematically illustrates an enlarged cut-away perspective view of an embodiment of a portion of cell 10 that is shown in FIG. 1. This description has references to FIG. 1, FIG. 2, and FIG. 3. Cell 10 is formed on a semiconductor substrate 25. Typically, substrate 25 includes a bulk semiconductor substrate or bulk substrate 13 that has a buried layer 14 formed on a portion of the surface of bulk substrate 13, and an epitaxial layer 17 that is formed on buried layer 14. Typically, bulk substrate 13 is of a first conductivity type and layers 14 and 17 are of a second conductivity type. An insulator 31 is formed on the surface of layer 17. In some areas, insulator 31 forms a gate insulator as will be seen hereinafter. An isolation well 16 of the same conductivity type as bulk substrate 13 generally extends from the surface of layer 17 to bulk substrate 13 in order to isolate cell 10 from other elements formed on bulk substrate 13. Buried layer 14 typically underlies gate 29 and transistors 11 and 12 but may not extend across the entire surface of bulk substrate 13, thus, layer 17 may be formed on the surface of bulk substrate 13 in some places. For example, as illustrated in FIG. 3, layer 14 typically does not extend completely to well 16. In the preferred embodiment, bulk substrate 13 and well 16 are P-type, layers 14 and 17 are N-type, and insulator 31 is silicon dioxide. Layers 14 and 17 may be formed by a variety of techniques that are well known to those skilled in the art. For example, layer 14 may be formed by doping a portion of bulk substrate 13 using diffusion or ion implantation techniques and layer 17 maybe epitaxially formed on layer 14. Alternately, layers 14 and 17 may be formed as doped regions of bulk substrate 13. Layer 14 typically is about two to seven (2–7) microns thick and preferably is about six microns, and is doped to a resistivity between about six and fifteen (6–15) ohm-cm and preferably is about ten (10) ohm-cm. Layer 17 typically is about three to ten (3–10) microns thick and preferably is about five microns, and is doped to a resistivity between 0.7 and 30.0 ohm-cm and preferably is about one (1) ohm-cm.

Transistor 11 includes a doped region 18 that is formed on the surface of substrate 25 and extends a first distance into substrate 25 and preferably the first distance into layer 17. A source region or source 19 of transistor 11 is formed within region 18 by doping a portion of region 18. The first distance typically is between about one and five (1–5) microns and preferably is about three (3) microns. A source electrode 21 provides electrical contact to source 19. Similarly, a drain region or drain 23 is formed as another doped area within region 18 underlying a drain electrode 22. Portion 26 of floating gate 29 is disposed overlying a portion of region 18 that is between source 19 and drain 23 in order to form a gate of transistor 11. A portion of insulator 31 is disposed as a gate between portion 26 and region 18. Typically region 18 is about two to four (2–4) microns deep, about ten to twenty (10–20) microns wide, and has a doping concentration between $1.0 \text{E}16$ atoms/cm$^3$ and $1.0\text{E}17$ atoms/cm$^3$. Source 19 and drain 23 have a depth that is less than the depth of region 18 and typically are spaced apart a distance between approximately 0.2 and 10.0 microns. As those skilled in the art will understand, the spacing distance may shrink as technology advances. A body contact 43 is formed within region 18 to facilitate forming contact to region 18 during programming of cell 10 and for biasing region 18 during other operations of cell 10. A body electrode 44 provides electrical connection to contact 43. In the preferred embodiment, region 18 and contact 43 are P-type while source 19 and drain 23 are N-type. In this preferred embodiment, source 19 and drain 23 have a doping concentration that is greater than the doping concentration of layer 17 and generally is between about 1.0E19 atoms/cm$^3$ and 1.0E21 atoms/cm$^3$.

Cell 10 includes a doped region 36 that is formed on the surface of substrate 25 within layer 17 and is spaced laterally from region 18. As will be seen subsequently, region 36 functions as both the control gate of cell 10 and as the drain of transistor 12.

Transistor 12 includes a doped region 37 that is formed on the surface of substrate 25 and extends a second distance into substrate 25 and preferably the second distance into layer 17. Region 37 functions as the body of transistor 12. Region 37 assists in increasing the breakdown voltage of transistor 12 and minimizing the effects of the depletion region formed around region 36 during programming of cell 10. A source 38 of transistor 12 is formed as a doped region within region 37 near to region 36. Source 38 typically is formed with portion of region 37 separating region 36 and source 38. A body contact 39 is also formed as another doped region that is within region 37 and adjacent to source 38. Positioning region 37 adjacent to region 36 facilitates using a first portion of region 36 for the drain of transistor 12. In the preferred embodiment, region 37 is formed to touch region 36. Also in this preferred embodiment, region 37 is doped N-type with a doping concentration about 1.0E17 atoms/cm$^3$ to 1.0E18 atoms/cm$^3$, contact 39 is N-type with a doping concentration between approximately 1.0E19 atoms/cm$^3$ to 1.0E21 atoms/cm$^3$, and source 38 is P-type with a doping concentration of about 1.0E19 atoms/cm$^3$ to 1.0E21 atoms/cm$^3$. Gate 41 of transistor 12 is formed to overlay a portion of source 38, a portion of region 37 that is between source 38 and region 36, and a first portion of region 36. When transistor 12 is enabled, a conduction channel or a channel region of transistor 12 is formed in the portion of region 37 that is both underlying gate 41 and between source 38 and region 36.

Third portion 28 of floating gate 29 is formed to overlay a second portion of region 36 and is spaced apart from gate 41. The distance between gate 41 and portion 28 of gate 29 typically is determined by the photolithographic capabilities of the process used for forming cell 10. In one example embodiment, gate 41 is formed about one micron from portion 28. A portion of insulator 31 is formed as a gate insulator between portion 28 and region 36. Region 36 generally is spaced apart from region 18 by a distance that is sufficient to ensure that the depletion region formed around region 36 does not affect the operation of transistor 11. Typically, region 36 is between approximately four to six (4–6) microns from region 18.

A field oxide 32 typically overlies the portion of substrate 25 that is between regions 18 and 36 and underlies second portion 27 of floating gate 29. Field oxide 32 helps prevent portion 27 from disturbing the operation of transistor 11 as is well known in the art. Another field oxide 33 may also be formed between transistor 12 and well 16.

Programming of cell 10 typically is performed by applying a low potential, such as ground, to contact 43, source 19, and drain 23 of transistor 11, applying a programming voltage to source 38 and body contact 39 of transistor 12, and applying a data signal to gate 41. Typically, the programming voltage is a much higher than the normal operating voltage of transistor 11 and generally is about twenty to thirty volts (20–30V). The normal operating voltage of transistor 11 is the voltage used under normal operating conditions and typically is between three and five volts (3–5V). The data signal is either a low voltage, typically ground, for a logic zero or approximately the normal operating voltage for a logic one. For the example of programming cell 10 with a programming voltage of thirty volts and a data of logic one, the data turns-on transistor 12 which generates a voltage on the drain portion of region 36 that is approximately equal to the programming voltage of thirty volts. Since region 36 also functions as the control gate, the thirty volts is applied to the control gate and a corresponding voltage is induced onto portion 28 of floating gate 29. The voltage induced into floating gate 29 is applied across the channel region of transistor 11 by portion 26 of floating gate 29. The high voltage across the channel region causes charges to be injected from region 18 into floating gate 29 and distributed throughout floating gate 29 thereby changing the threshold voltage of transistor 11. The effects of such a threshold change are well known to those skilled in the art. If the data were a logic zero instead of a logic one, transistor 12 would not be turned-on and would not apply the programming voltage to the control gate, thus, the threshold voltage of transistor 11 would not be changed. During the programming operation, region 37 assists in increasing the breakdown voltage of transistor 12 and minimizes the effects of the depletion region that the high programming voltage creates around region 36. Without region 37, region 36 could not be used as both the drain of transistor 12 and the control gate of cell 10. Thus, region 37 facilitates integrating control transistor 12 with the control gate into cell 10 and facilitates using region 36 to form both the drain of transistor 12 and the control gate. Integrating transistor 12 with the control gate reduces the area required to form cell 10. In most embodiments, cell 10 is between fifty and seventy-five percent (50–75%) smaller than prior EPROM cells.

Since regions 18 and 36 are of the same conductivity type, regions 18 and 36 can be formed in substrate 25 during the same processing operation. Region 37 generally is formed after forming regions 18 and 36. Source 19, drain 23, and contact 39 can be formed during the same processing operation since they have the same conductivity type.

In view of all of the above, it is evident that a novel device and method is disclosed. Included, among other features, is forming a control transistor of an EPROM cell as a portion of the control gate of the EPROM cell. Also included is using a doped region as the control gate of the EPROM cell and as the drain of the control transistor. Each of these features reduces the area required for the EPROM cell.

While the invention is described with specific preferred embodiments, it is evident that many alternatives and variations will be apparent to those skilled in the semiconductor arts. More specifically the invention has been described for a particular N-channel and P-channel MOS transistor structures, although the method is directly applicable forming other MOS transistors as well as BiCMOS, metal semiconductor FETs (MESFETs), HFETs, and other transistor structures. Additionally the conductivity types of the semiconductor regions may be reversed to obtain opposite transistor types.

The invention claimed is:
1. A method of forming an EPROM cell comprising:
  forming a portion of a control transistor as a portion of a control gate of the EPROM cell including forming a first doped region of a first conductivity type that is both the portion of the control gate and a drain of the control transistor.

2. The method of claim 1 further including forming a source of the control transistor within a second doped region of a second conductivity type that is adjacent to the first doped region.

3. The method of claim 1 wherein forming the portion of the control transistor as the portion of the control gate includes forming a first portion of a gate of the control transistor overlying the first portion of the first doped region and forming the control gate as a second portion of the first doped region.

4. The method of claim 3 further including forming a second doped region underlying a second portion of the gate of the control transistor.

5. The method of claim 4 further including forming a third doped region underlying the second portion of the gate of the control transistor and within the second doped region.

6. The method of claim 5 further including forming a fourth doped region within the second doped region and adjacent to the third doped region.

7. The method of claim 6 wherein forming the fourth doped region includes forming the first doped region and the third doped region of a first conductivity type and forming the second doped region and the fourth doped region of a second conductivity type.

8. The method of claim 1 wherein forming the portion of the control transistor as the portion of the control gate of the EPROM cell includes forming a first portion of the control gate underlying a gate of the control transistor and a second portion of the control gate underlying a floating gate of the EPROM cell.

9. A method of forming an EPROM cell comprising;
providing a semiconductor substrate;
forming a first doped region on the semiconductor substrate;
forming a second doped region on the semiconductor substrate adjacent to the first doped region;
forming a control transistor having a gate with a first portion of the gate of the control transistor overlying a first portion of the first doped region; and
forming a floating gate overlying a second portion of the first doped region wherein the second portion is different from the first portion.

10. The method of claim 9 wherein forming the first doped region includes forming the first doped region of a first conductivity type and forming the second doped region of a second conductivity type.

11. The method of claim 9 further including forming a third doped region within the second doped region and underlying a second portion of the gate of the control transistor.

12. The method of claim 11 further including a forming a fourth doped region within the second doped region and adjacent to the third doped region.

13. The method of claim 12 including forming the first doped region and the third doped region of a first conductivity type and forming the second doped region and the fourth doped region of a second conductivity type.

14. A method of forming an EPROM cell comprising:
providing a substrate having a surface;
forming a first doped region of a first conductivity type on the surface of the substrate;
forming a source and a drain of a first MOS transistor within the first doped region and disposing a gate of the first MOS transistor between the source and the drain and overlying a portion of the first doped region;
forming a second doped region of the first conductivity type on the surface of the substrate wherein a first portion of the second doped region is a control gate and a second portion of the second doped region is a drain of a second MOS transistor; and
forming a portion of a floating gate overlying the first portion of the second doped region.

* * * * *